United States Patent
Manning (10) Patent No.: US 6,449,210 B1
(45) Date of Patent: Sep. 10, 2002

(54) SEMICONDUCTOR MEMORY ARRAY ARCHITECTURE

(75) Inventor: Troy Manning, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/921,838

(22) Filed: Aug. 2, 2001

(51) Int. Cl.$^7$ ................................................ G11C 8/00
(52) U.S. Cl. .............................. 365/230.03; 365/230.06
(58) Field of Search ....................... 365/230.03, 230.06, 365/231, 196, 207

(56) References Cited

U.S. PATENT DOCUMENTS

| | | | | |
|---|---|---|---|---|
| 5,184,321 A | * | 2/1993 | Konishi et al. ............... | 365/51 |
| 5,675,529 A | * | 10/1997 | Poole .......................... | 365/63 |
| 5,831,928 A | * | 11/1998 | Nakano et al. .............. | 365/233 |
| 6,034,914 A | * | 3/2000 | Inaba et al. ............ | 365/230.06 |
| 6,288,967 B2 | * | 9/2001 | Fujisawa et al. ............ | 365/226 |

* cited by examiner

*Primary Examiner*—David Nelms
*Assistant Examiner*—Thong Le
(74) *Attorney, Agent, or Firm*—Williams, Morgan & Amerson, P.C.

(57) ABSTRACT

A semiconductor memory device includes a sub-array of memory cells coupled to row lines and column lines. Row address decode circuitry selects at least one of the row lines in the sub-array. The column decode circuitry comprises two parts. A first part is adapted to select a subset of the column lines through cooperation with column select lines that are positioned substantially parallel to the row lines. A second part of the column address decode circuitry is positioned proximate an end of the column lines and is adapted to select at least one column line from the subset of column lines. The input/output lines are positioned substantially parallel to the column lines.

23 Claims, 8 Drawing Sheets

SEMICONDUCTOR MEMORY ARRAY ARCHITECTURE

BACKGROUND OF THE INVENTION

1. Field of the Invention

This invention relates generally to semiconductor memory array architectures, and, more particularly, to a semiconductor memory array architecture in which certain address decoding is divided into at least two parts to decrease the amount of space required for decoding lines and increase the amount of space available for data input/output lines.

2. Description of the Related Art

Figure 1:
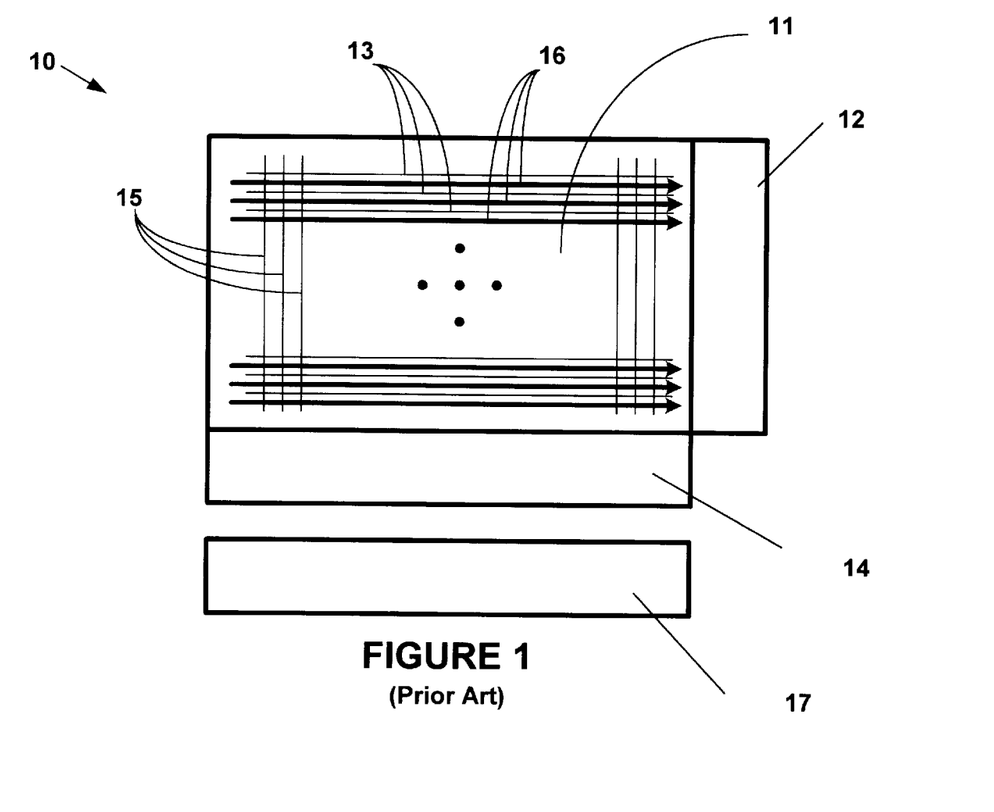
FIG. 1 illustrates a prior art arrangement of a semiconductor memory sub-array with row and column decoding and input/output lines.

A semiconductor memory, for example, a dynamic random access memory ("DRAM"), typically comprises an array of memory cells, address decoding circuitry for selecting one, or a group, of the memory cells for reading or writing data, sensing circuitry for detecting the digital state of the selected memory cell or memory cells, and input/output lines to receive the sensed data and convey that information for eventual output from the semiconductor memory. In many cases, the array of memory cells will be sub-divided into several sub-arrays, or subsets of the complete collection of memory cells. For example, a semiconductor memory having 16 megabits ($2^{24}$ bits) of storage capacity, may be divided into 64 sub-arrays, each having 256K ($2^{18}$) memory cells. FIG. 1 illustrates a portion 10 of a memory array. The portion 10 includes a sub-array 11 of memory cells that may include, for example, 256K memory cells. Row decoding circuitry 12 receives row address signals and, based on those signals, activates a selected row 13 in the sub-array 11. Column decoding circuitry 14 receives column address signals and, based on those signals, selects a particular column 15 in the sub-array 11. By selecting a specific row 13 and specific column 15, a particular memory cell may be accessed so that its contents may be read or so that data may be written into it. Input/output lines 16 convey data signals between the sub-array 11 and other parts of the memory array for ultimate transmission to or from outside the memory array.

As illustrated in FIG. 1, the row decoding circuitry 12 is arranged along one edge of the sub-array 11, while the column decoding circuitry 14 is arranged along an adjacent edge of the sub-array 11. The row decoding circuitry 12 drives the rows 13 which span the sub-array 11 in a direction perpendicular to the edge of the sub-array 11 along which the row decoding circuitry 12 is arranged. In the same manner, the column decoding circuitry 14 selects the columns 15, and the columns 15 span the sub-array 11 in a direction perpendicular to the edge of the sub-array 11 along which the column decoding circuitry 14 is arranged. The input/output lines 16 are situated parallel to the rows 13, and the input/output lines 16 exit the sub-array 11 over the row decoding circuitry 12. The architecture illustrated in FIG. 1 may use a two layer metal semiconductor process in which the input/output lines 16 are formed in the first metal layer and the column decoding circuitry 12 is formed on the second metal layer.

Figure 2:
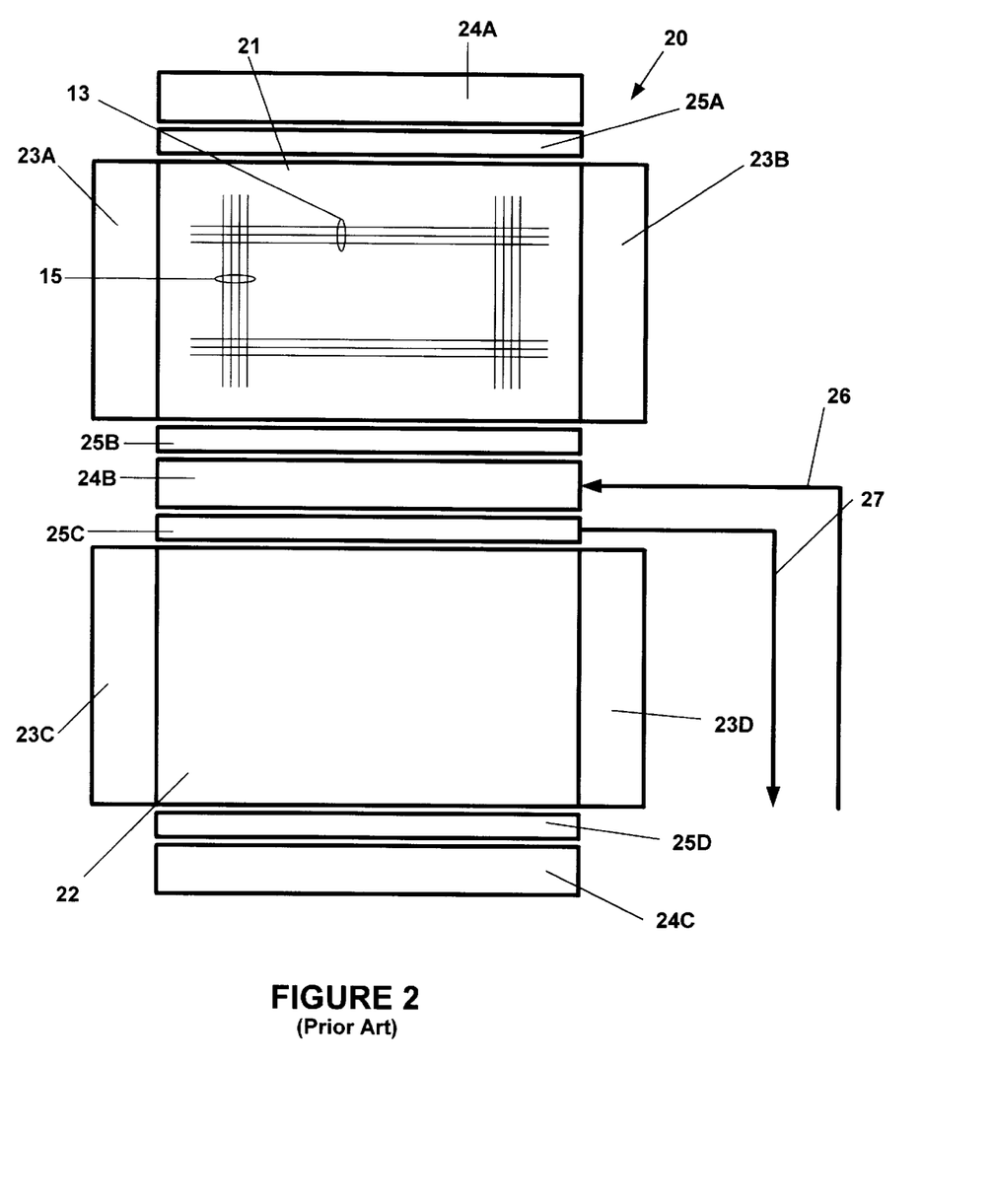
FIG. 2 illustrates another prior art arrangement of a semiconductor memory sub-array with row and column decoding and input/output lines.

FIG. 2 shows an alternative architecture for a semiconductor memory. A portion of a memory array 20 will include sub-arrays 21 and 22. Row decoding circuitry 23A–23D is arranged along opposing ends of each of the sub-arrays 21 and 22. Column decoding circuitry 24B is arranged between the sub-arrays 21 and 22, and the column address signals are coupled to the column decoding circuitry 24B by lines 26. Additional column decoding circuitry 24A and 24C is arranged along edges of the sub-arrays 21 and 22 opposing the edge along which the column decoding circuitry 24B is located. The column decoding circuitry 24B may be shared between the sub-arrays 21 and 22, the circuitry 24A may be shared between the sub-array 21 and a next adjacent sub-array, and the circuitry 24C may be shared between the sub-array 22 and a next adjacent sub-array. Sense amplifier circuitry 25A–25D is arranged alongside the column decoding circuitry 25A–25D and the sub-arrays 21 and 22. Each of the sub-arrays 21 and 22 has associated with it sense amplifier pull-down circuitry 25A and 25C, respectively, and sense amplifier pull-up circuitry 25B and 25D, respectively. In the architecture illustrated in FIG. 2, the complete sense amplifier for the sub-array 21 includes active pull-up devices in the circuitry 25B as well as active pull-down devices in the circuitry 25A. Input/output lines 27 are coupled to the sense amplifier circuitry 25A–25D and are routed to the periphery of the memory device.

As memory array architectures grow wider in terms of input/output lines, the testability, repair planes, and the size of the input/output routes themselves become a difficult problem to overcome. The amount of space required to accommodate the ever-growing number of input/output lines has become relatively large. Enlarging the semiconductor memory chip to accommodate the added space required for the growing number of input/output lines is an undesirable solution.

SUMMARY OF THE INVENTION

The present invention involves a semiconductor memory device having a first sub-array, the first sub-array including a first plurality of memory cells coupled to row lines and column lines, wherein the row lines are positioned substantially orthogonal to the column lines. Row address decode circuitry is coupled to the row lines and is adapted to select and activate at least one of the row lines. First column select lines are positioned substantially parallel to the row lines, and first column address decode circuitry is coupled to the first column select lines and is adapted to select a subset of the column lines. Second column address decode circuitry is positioned proximate an end of the column lines and is adapted to select at least one column line from the subset of column lines. Input/output lines are positioned substantially parallel to the column lines. The semiconductor memory device may also include a second sub-array having a second plurality of memory cells coupled to row lines and column lines. Second column select lines may be positioned substantially parallel to the row lines in the second sub-array. Third column address decode circuitry is coupled to the second column select lines and is adapted to select a subset of the second column lines. The second column address decode circuitry is adapted to select at least one column line from one of the subsets of the first column lines and second column lines.

In another aspect of the present invention, a semiconductor memory device comprises first and second sub-arrays, each sub-array having a plurality of memory cells coupled to row lines and column lines in a sub-array. First and second row address decode circuitry is coupled to the first and second sub-arrays, respectively, and is adapted to select at least one row line in the respective sub-arrays. First column address decode circuitry is coupled to first column select lines, the first column select lines being situated substantially parallel to the row lines in the first sub-array. The first column address decode circuitry is adapted to select a plurality of column lines in the first sub-array. Second column address decode circuitry is coupled to second column select lines, the second column select lines being situated substantially parallel to the row lines in the second sub-array. The second column address decode circuitry is adapted to select a plurality of column lines in the second sub-array. Third column address decode circuitry is coupled to third column select lines and is adapted to select at least one of the plurality of column lines selected by one of the first and second column decoding circuitry. Input/output lines are situated substantially parallel to the column lines in the first and second sub-arrays and are adapted to transmit data signals from at least one memory cell in one of the first and second sub-arrays. The semiconductor memory device may also include a plurality of sense amplifiers, wherein each sense amplifier is coupled to a column line in the first sub-array and to a column line in the second sub-array.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

As described above, FIGS. 1 and 2 illustrate architectural features of known semiconductor memory devices. FIG. 1 represents a conventional arrangement in which row address decoding circuitry 12 is positioned on a first edge of a memory sub-array 10 and is coupled to row lines 13, or word lines, that traverse the sub-array 10. The sub-array 10 of FIG. 1 may include, for example, 256K ($2^{18}$) memory cells and 512 ($2^9$) row lines 13. The row address decoding circuitry 12 selects one of the 512 row lines 13 for activation in response to a set of row address signals. Each row line 13 is coupled to memory cells in the sub-array 10 and, when activated, the row line 13 will couple each of its memory cells to its respective column 15, or digit line. Column address decoding circuitry 14 is positioned on a second edge of the memory sub-array 10 and is coupled to the columns 15 that traverse the sub-array 10 in a direction substantially perpendicular to the direction of the row lines 13. The 256K memory sub-array 10 in FIG. 1 may include 512 columns 15, each of which may be coupled to 512 memory cells, one memory cell for each of the 512 row lines 13. In response to column address signals, the column address decoding circuitry 14 couples one or more of the 512 columns 15 to sense amplifiers 17. The selection of a row line 13 and a column 15 will result in the sensing of the logical state of the memory cell located at the intersection of that row line 13 and column 15. The signal representing the logical state of that memory cell will then be coupled to a selected input/output line 16. The input/output lines 16 traverse the memory sub-array 10 in a direction parallel to the row lines 13 and perpendicular to the columns 15. The input/output lines 16 exit the sub-array 10 over the row address decoding circuitry 12.

FIG. 2 shows a slightly different arrangement of a semiconductor memory device. Sub-arrays 21 and 22 each include a plurality (e.g., 256K) of memory cells coupled to row lines 13 and columns 15 in a manner similar to that described in connection with the sub-array 10 of FIG. 1. The row address decoding circuitry 23A and 23B for the sub-array 21 is aligned along opposing edges of the sub-array 21, with one half of the row address decoding circuitry 23A on one edge and the other half 23B on an opposing edge. Each half, 23A and 23B, of the row address decoding circuitry drives half the row lines 13 in the sub-array 21. In like manner, the row address decoding circuitry 23C and 23D for the sub-array 22 is divided into two halves aligned on opposing edges of the sub-array 22, and each half, 23C and 23D, drives half the row lines 13 in the sub-array 22.

The column address decoding circuitry 24A, 24B, 24C for the sub-arrays 21 and 22 is positioned on opposing edges of the sub-arrays 21 and 22. The circuitry 24B is positioned between the sub-arrays 21 and 22 and is shared by the sub-arrays 21 and 22. The circuitry 24A is positioned between the sub-array 21 and another sub-array (not shown) and is shared between those two sub-arrays 21, 22. The circuitry 24C is positioned between the sub-array 22 and another sub-array (not shown) and is shared by those two sub-arrays. Each of the sub-arrays 21, 22 has associated with it sense amplifier circuitry that may be coupled to the columns 15 for detecting the logical state of the memory cells in the sub-arrays 21, 22. The sense amplifier circuitry 25A, 25B for the sub-array 21 includes active pull-down devices 25A and active pull-up devices 25B. The sense amplifier circuitry 25C, 25D for the sub-array 22 includes active pull-down devices 25C and active pull-up devices 25D. A particular sense amplifier for the sub-array 21 includes active pull-down devices from the circuitry 25A and active pull-up devices from the circuitry 25B. One sense amplifier exists for every two digit lines in the sub-array 21, and the sense amplifier arrangement is described as "halfpitch." Also, because the column address decoding circuitry 24B is associated with one-half the sense amplifier circuitry for the sub-array 21 (and one-half the sense amplifier circuitry for the sub-array 22), the column address decoding circuitry may be described as "partially embedded" in the sense amplifiers. In the arrangement of FIG. 2, the input/output lines 27 exit the sub-arrays by way of the sense amplifiers 25B, 25C.

Figure 3:
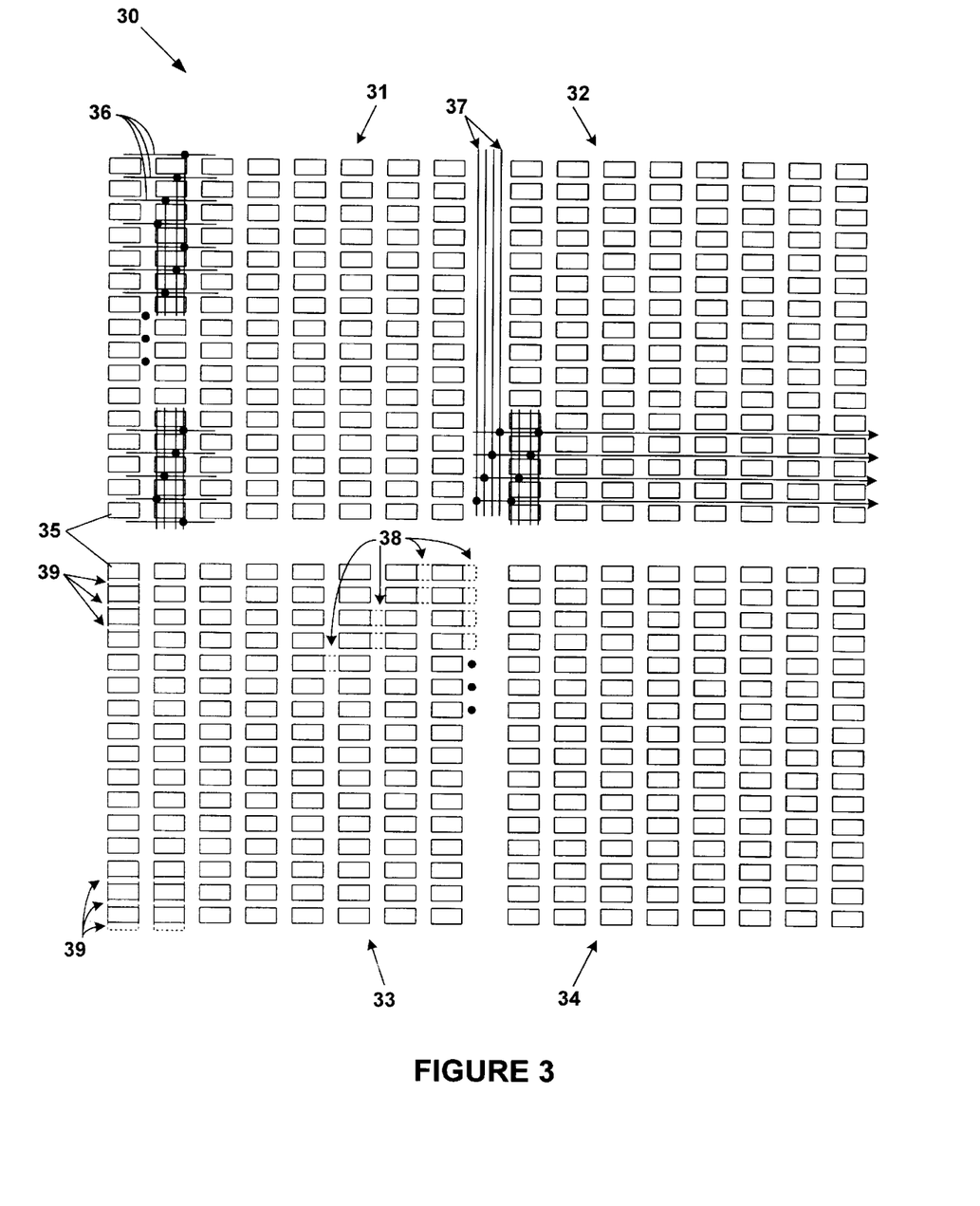
FIG. 3 illustrates one particular memory array arranged according to the present invention.

FIG. 3 illustrates one particular semiconductor memory device, a DRAM, arranged according to the present invention. The memory device of FIG. 3 is a 128 megabit DRAM, meaning that it includes 128M ($2^{27}$) memory locations. The DRAM 30 is arranged in four quadrants 31, 32, 33 and 34, each quadrant having 128 sub-arrays 35, with each sub-array 35 comprising 256K memory locations. FIG. 3 illustrates generally some of the features incorporated in the DRAM 30. For example, input/output lines 36 are illustrated in part in conjunction with quadrant 31. Column decoding lines 37 are illustrated in part in conjunction with quadrant 32. Row decoding lines 38 and sense amplifiers 39 are illustrated in part in conjunction with quadrant 33. As those of ordinary skill in the art, having the benefit of this disclosure, will appreciate, the column decoding lines 37 and the row decoding lines 38 are activated to select a particular DRAM cell or a set of particular DRAM cells. The selected cell or set of cells may then be coupled to their respective sense amplifiers, and the "contents" of the cells (e.g., a digital "0" or a digital "1") may be coupled to the appropriate input/output lines 36 for transmission to an external pin, for example. The input/output lines 36 also facilitate the writing of data into the cells.

Figure 4:
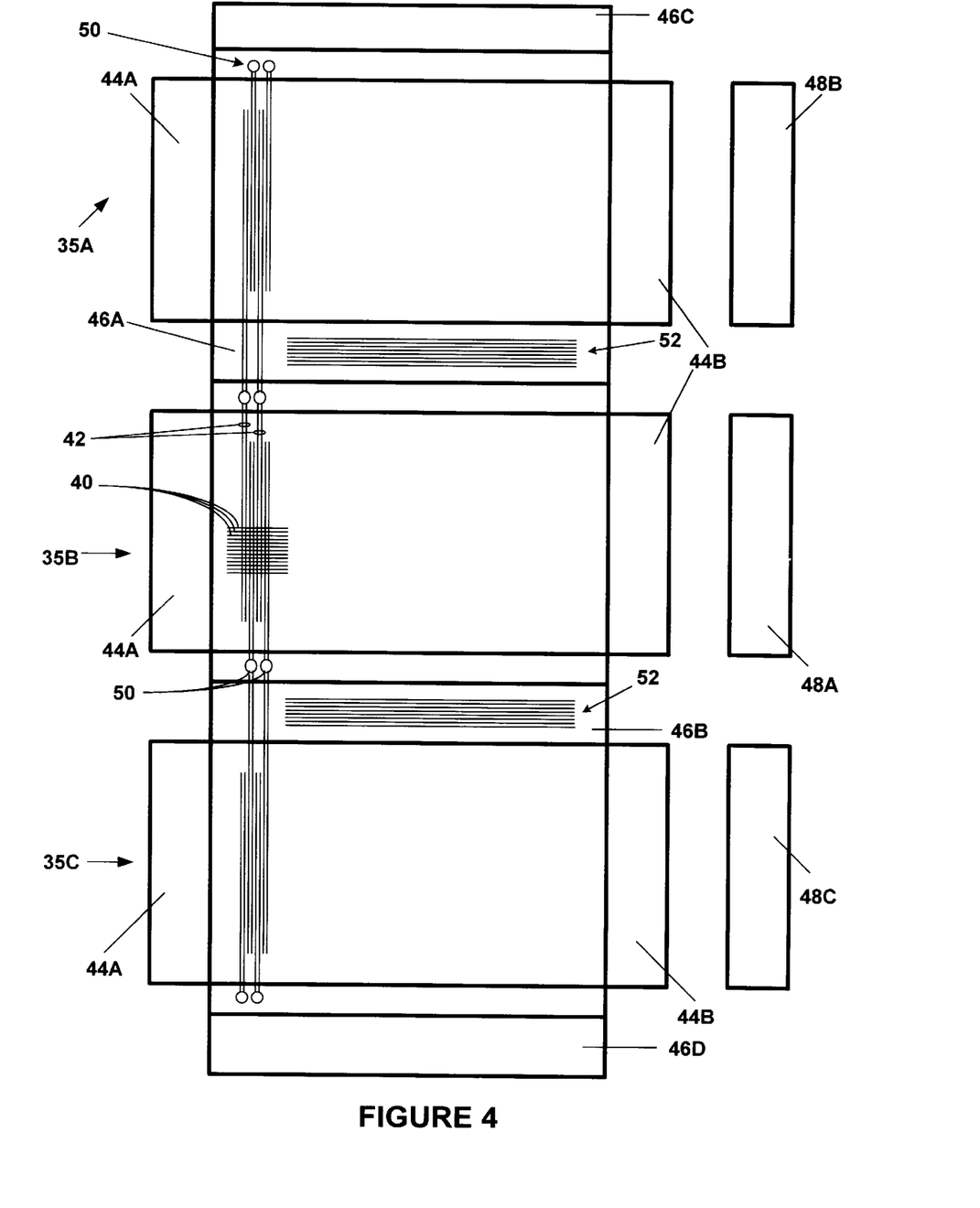
FIG. 4 illustrates an arrangement of sub-arrays, column decoding circuitry, and sense amplifier circuitry in accordance with the present invention.

FIG. 4 illustrates three sub-arrays 35A, 35B and 35C from the particular DRAM 30 shown in FIG. 3. Each of the sub-arrays 35A, 35B and 35C includes 256K memory locations. Each of the memory locations is accessed for reading or writing data by means of row lines 40 and column lines 42. Considering the sub-array 35B, row address decoding circuitry 44A, 44B receives row address signals and decodes those signals to select a particular row line 40 from 512 row lines in the sub-array 35B. Activating a row line 40 couples the memory cells on that row line 40 to their respective digit lines 42. The digit lines 42 terminate in sense amplifiers 50 in pairs. That is, each sense amplifier 50 is coupled to a pair of digit lines 42. Each of the sense amplifiers 50 includes both active pull-up devices and active pull-down devices together on the same edge of the sub-array 35B. The pull-up and pull-down devices are not positioned on opposing edges of the sub-array 35B, as was the case with the memory arrangement shown in FIG. 2. Also, as shown in FIG. 4, the sense amplifiers 50 on a given edge of the sub-array 35B are coupled to alternating pairs of digit lines 42. This sense amplifier arrangement may be referred to as "quarter-pitch," because there is one sense amplifier 50 for every four digit lines 42. The sub-array 35B (and all the sub-arrays 35 in the array 30 of FIG. 3) includes 512 digit line pairs and includes 512 sense amplifiers 50, with 256 sense amplifiers on each of two edges of the sub-array 35B.

The column address decoding circuitry for the particular sub-array 35B of FIG. 4 (and, in like manner, for all the sub-arrays 35 of FIG. 4) is divided into three parts, 46A, 46B and 48A, each of which is partial term decoding. In this situation, a "column" equates to a "digit line pair." The edge column decoding circuitry 46A, 46B performs a one-of-eight decode that will be explained in greater detail in connection with FIGS. 5 and 6. The end column decoding circuitry 48A also performs a one-of-eight column selection. This one-of-eight selection by the end column decoding circuitry 48A utilizes eight column decode lines 52 that span the length of the sub-array 35B. By separating the column decoding into edge column decoding 46A/46B and end column decoding 48A and by performing a partial column select by means of the end column decoding 48A, the number of column decode lines extending between the sense amplifiers, that is, orthogonal to the row lines 40, is greatly reduced. By reducing the space occupied by column decode lines orthogonal to the row lines 40, the vacated space may be utilized for routing of input/output lines and other needs (e.g., local routing).

Continuing with the particular embodiment of FIG. 4, the edge column address decoding circuitry 46A performs column selection, alternatively, in sub-arrays 35A and 35B, and the edge column address decoding circuitry 46B performs column selection, alternatively, in the sub-array 35B and 35C. For example, when the sub-array 35B is to be accessed, the circuitry 46A and 46B will both be involved in the column selection in the sub-array 35B. If the sub-arrays 35A and 35C are to be accessed, the circuitry 46A will be involved, along with edge column address decoding circuitry 46C, in the column selection in the sub-array 35A, and the circuitry 46B will be involved, along with edge column address decoding circuitry 46D, in the column selection in the sub-array 35C. Thus, the edge column address decoding circuitry, for example, 46A, 46B, 46C and 46D, is shared by adjacent sub-arrays. In like manner, the sense amplifiers 50 and the input/output lines 52 (see FIG. 5) are shared by adjacent sub-arrays 35 in the memory array 30 (see FIG. 3). This sharing of column decoding lines, sense amplifiers and input/output lines between adjacent sub-arrays is well known to those of ordinary skill in the art.

Figure 5:
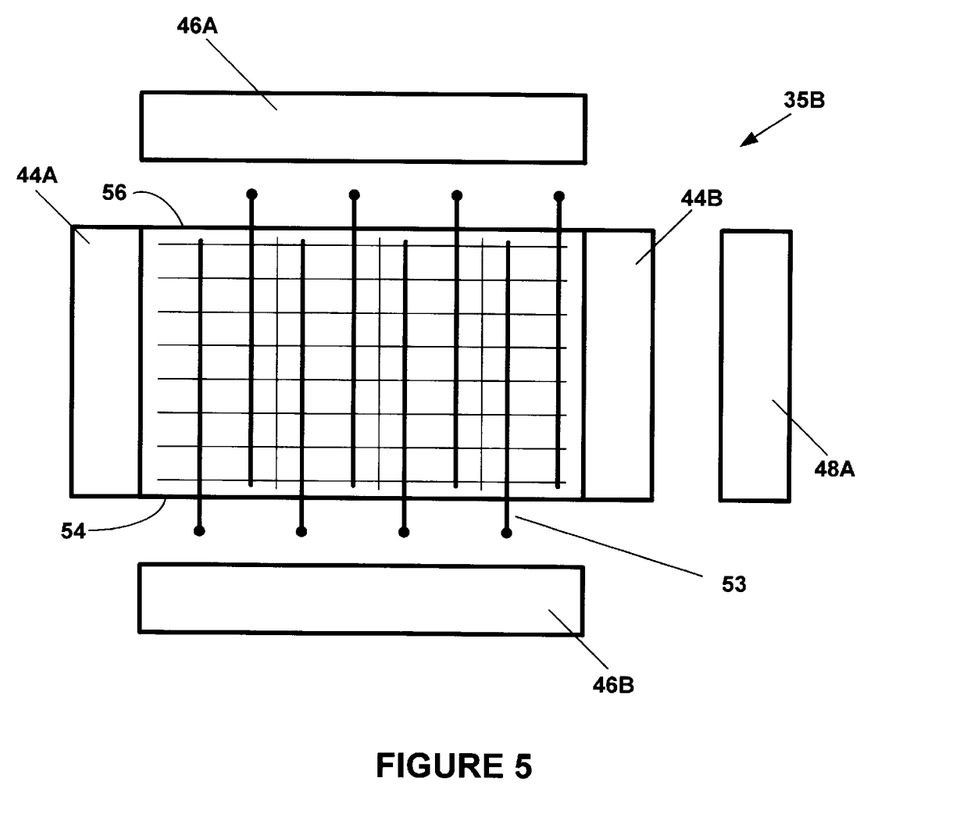
FIGS. 5 and 6 show alternative column decoding configurations for a 256K sub-array of the memory array of FIG. 3.

FIG. 5 shows further detail of the 256K sub-array 35B from FIG. 4. As already mentioned, the row address decoding circuitry 44A, 44B receives row address signals and decodes those address signals to select a particular row line 40 in the sub-array 35B (see FIG. 4). As also already mentioned, the column decoding circuitry is separated into parts 46A, 46B and 48A, each of which accomplishes partial term decoding. The edge column decoding circuitry 46A/46B and the end column decoding circuitry 48A each perform a 1-of-8 selection to accomplish an overall 1-of-64 column select in the sub-array 35B. The sub-array 35B comprises 512 digit line pairs and 512 row lines. Thus, a 1-of-64 column select from the sub-array 35B will accommodate eight bits of data. Each bit of data is communicated into or out of the sub-array 35B by an input/output line 53. As shown in FIG. 5, alternating input/output lines 53 exit the sub-array 35 at a first edge 54, while the remaining alternating input/output lines 53 exit the sub-array 35 at a second edge 56.

Figure 6:
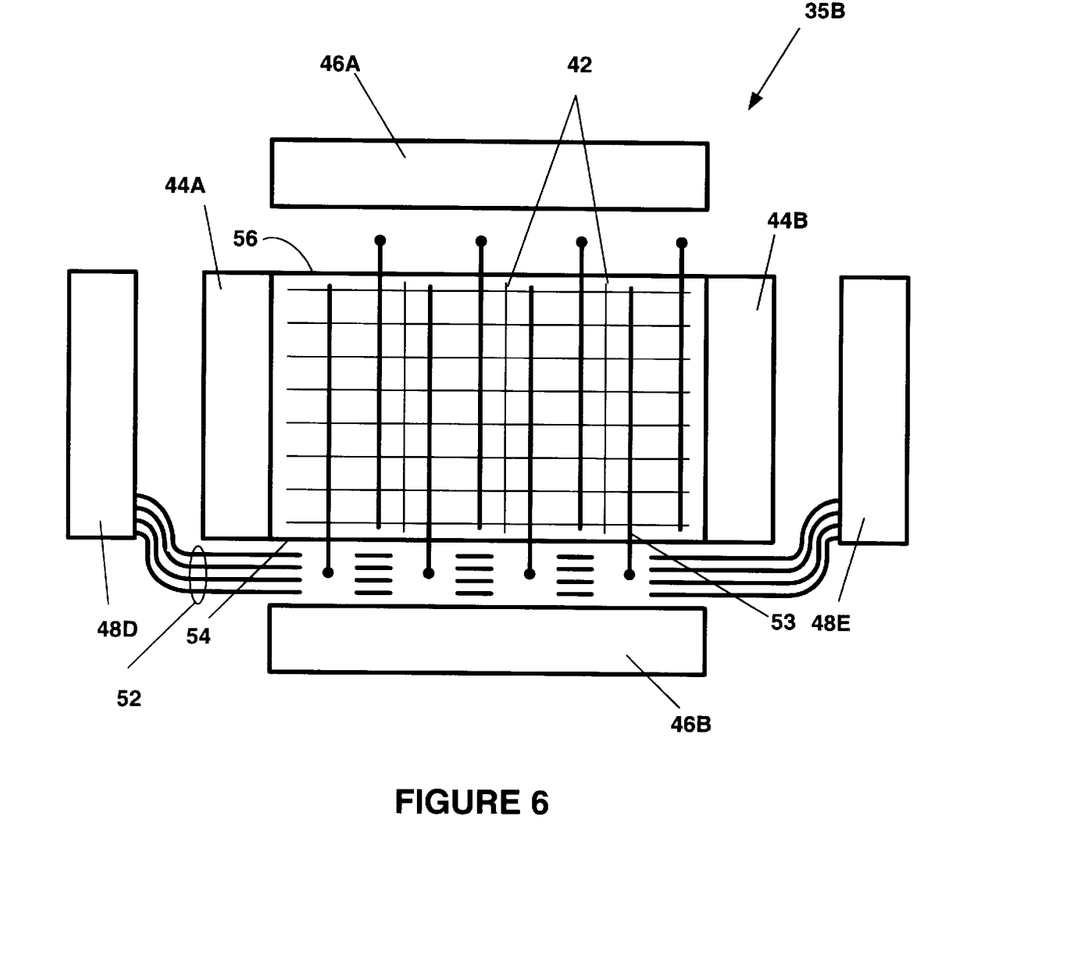

The column decoding circuitry in the present invention may be configured in ways other than that illustrated in the particular embodiment of FIGS. 4 and 5. For example, end column decoding circuitry 48A may be divided into two parts, and the two parts may be situated at opposing ends of the sub-array 35B (and, in like manner, each of the other sub-arrays 35 in the memory device). The end column decoding circuitry 48D and 48E may each perform a 1-of-4 column select and each be coupled to four column select lines. Also, the end column decoding 49A of FIGS. 4 and 5, as well as the end column decoding 48D and 48E of FIG. 6, may perform a 1-of-16 or 1-of-32 column select (instead of the 1-of-8 column select as shown in FIGS. 4, 5 and 6), leaving the edge column decoding 46A/46B to perform a 1-of-4 or 1-of-2 column select, respectively. That is, the division of column select between the edge column decoding and the end column decoding may vary within the scope of the present invention. Even further, all column decoding may be incorporated into the end column decoding circuitry 48D and 48E, thus eliminating any need for edge column decoding circuitry 46A/46B. Additionally, the column select lines 52, when used in conjunction with divided end column decoding, may be arranged in alternative configurations. For example, alternating select lines 52 may be interleaved and driven by opposing end column decoding circuitry, or a first group of four adjacent select lines 52 may be coupled to one end column decoding circuitry while a second group of four adjacent select lines 52 may be coupled to the opposing end column decoding circuitry. Also, the column select lines 52 may be arranged in various ways relative to the row lines 40. For example, the select lines 52 may be interleaved with the row lines 40. Alternatively, the select lines 52 may be formed in a layer of the semiconductor device different from the row lines 40 and the select lines 52 may be grouped in relatively close proximity (for example, near one edge of the sub-array) or spaced across the width of the sub-array. No particular layout of the column select lines 52, with respect to one another or with respect to the row lines 40, is mandated by the present invention. Also, no particular layout of the input/output lines 53, with respect to one another or with respect to the column lines 42, is mandated by the present invention.

Figure 7A:
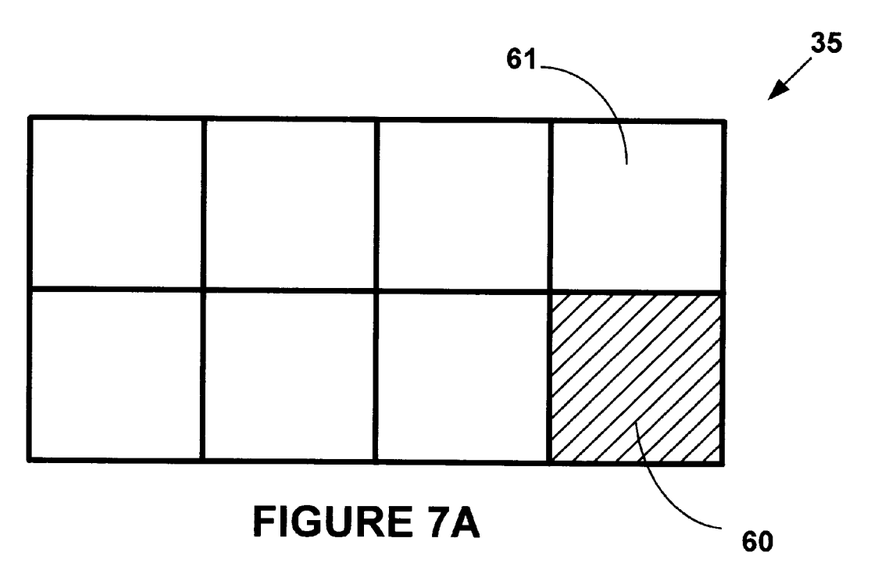
FIG. 7A shows one 256K sub-array of FIG. 5 sub-divided into eight blocks.
Figure 7B:
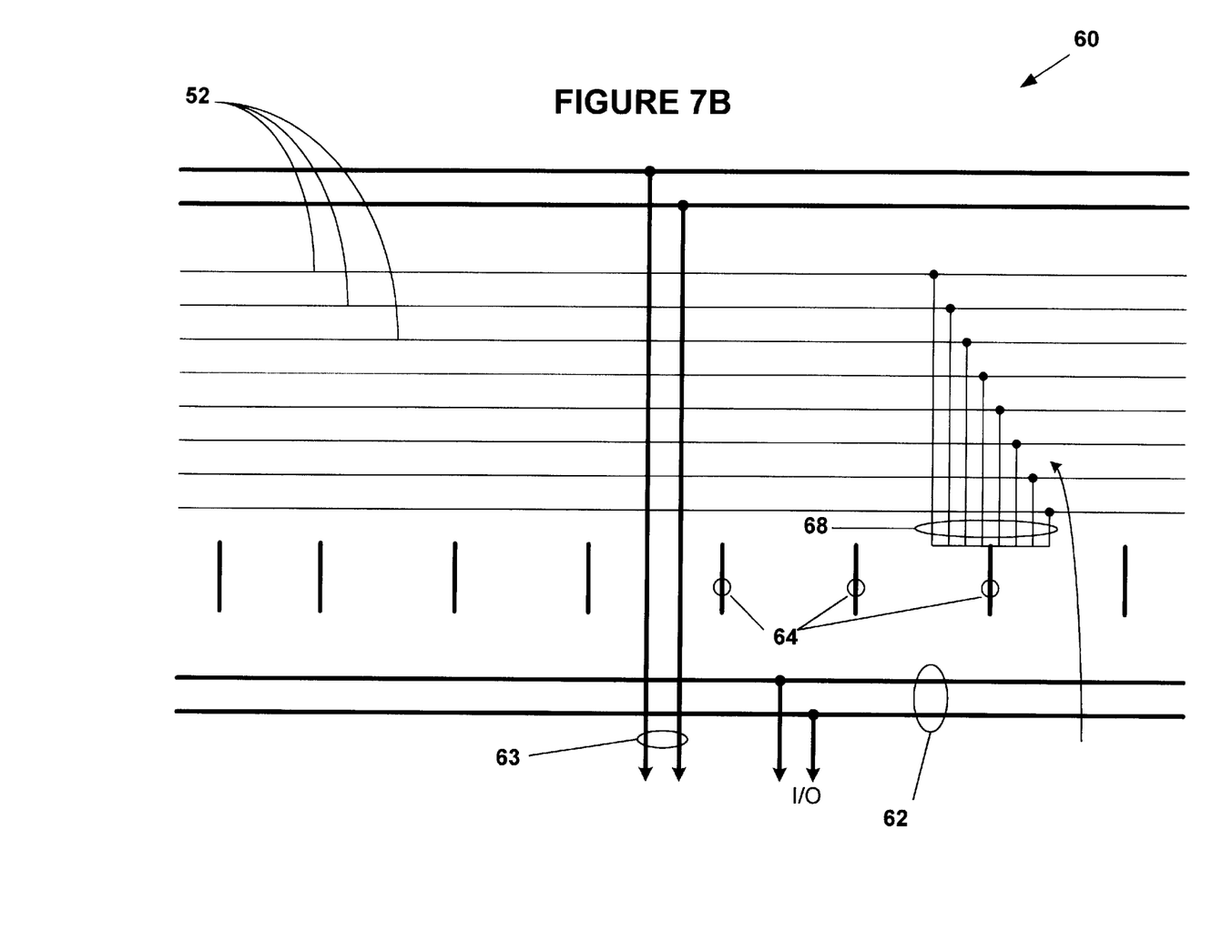
FIG. 7B shows input/output lines associated with one of the eight blocks from FIG. 6A.

FIGS. 7A and 7B further illustrate a sub-array 35 from the particular DRAM 30 of FIG. 3. FIG. 7A shows that the sub-array 35 is further divided into eight sub-blocks. One of the sub-blocks 60 of FIG. 7A is illustrated in greater detail in FIG. 7B. FIG. 7B shows the end column decode lines 52 that lie parallel to the row lines 40 and orthogonal to the column lines 42 (see FIG. 4). The end column decode lines 52 perform a one-of-eight column select function. FIG. 7B also shows a main input/output line pair 62 that transmit one bit of data from or to the sub-block 60 in the sub-array 35. Each sub-block 60 within the sub-array 35 includes a main input/output line pair 62, and the sub-array 35 will yield eight bits of data from the eight sub-blocks 60. For example, the sub-block 61 in FIG. 7A may produce a bit of data out on the main input/output line pair 63 in FIG. 7B. The sub-blocks 60 each include eight groups 64 of input/output line pairs, each group 64 having eight input/output line pairs 68. The one-of-eight column select decoding accomplished by the lines 52 will select one of the input/output line pairs 68 from each group 64 for possible coupling to the main input/output line pair 62. Thus, each of the input/output line groups 64 will have selected from it, upon the one-of-eight selection by the end column decode lines 52, one of the input/output line pairs 68, and a total of eight input/output line pairs 68 will thereby be selected in each sub-block 60. The edge column decoding circuitry 46A/46B (see FIG. 5) will select one of the eight selected input/output line pairs 68 to be coupled to the common input/output line pair 62 for output from the sub-block 60. Each of the eight sub-blocks 60 within the sub-array 35 will output a single bit of data in like manner, resulting in a total of eight bits of data from the sub-array 35. Because the column decoding circuitry has been divided two parts 46A/46B and 48, and because the end column decoding lines 52 span the length of the sub-array 35 rather than extend orthogonally to the row lines 40 (see FIG. 4), space that would have otherwise been consumed by more column decode lines extending orthogonally to the row lines 40 is vacated and made available for input/output lines. Thus, the number of input/output lines that may be routed through the DRAM 30 is greatly increased without increasing the overall size of the semiconductor chip.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor memory device, comprising:

a first sub-array, the first sub-array including a first plurality of memory cells coupled to a first plurality of row lines and a first plurality of column lines, the first plurality of row lines positioned substantially orthogonal to the first plurality of column lines;

row address decode circuitry coupled to the first plurality of row lines and adapted to select and activate at least one of the first plurality of row lines;

a first plurality of column select lines positioned substantially parallel to the first plurality of row lines;

first column address decode circuitry coupled to the first plurality of column select lines and adapted to select a subset of the first plurality of column lines, the first column address decode circuitry being positioned proximate at least one of a first and a second end of the first plurality of column select lines; and a plurality of input/output lines positioned substantially parallel to the first plurality of column lines.

2. The semiconductor memory device of claim 1, further comprising a plurality of sense amplifiers coupled to the first plurality of column lines.

3. The semiconductor memory device of claim 1, wherein the first column address decode circuitry comprises:

a first subcircuit coupled to a first subset of the column select lines; and a second subcircuit coupled to a second subset of the column select lines.

4. The semiconductor memory device of claim 3, wherein the first and second subcircuits are positioned at the first and second ends of the column select lines, respectively.

5. The semiconductor memory device of claim 4, wherein the row address decode circuitry is positioned proximate at least one of a first end and a second end of the first sub-array.

6. The semiconductor memory device of claim 5, wherein the row address decode circuitry is positioned at the first and second ends of the sub-array.

7. The semiconductor memory device of claim 1, further comprising a second column address decode circuitry positioned proximate an end of the first plurality of column lines and adapted to select at least one column line from the subset of the first plurality of column lines.

8. The semiconductor memory device of claim 7, further comprising:

a second sub-array, the second sub-array including a second plurality of memory cells coupled to a second plurality of row lines and a second plurality of column lines;

a second plurality of column select lines positioned substantially parallel to the second plurality of row lines; and third column address decode circuitry coupled to the second plurality of column select lines and adapted to select a subset of the second plurality of column lines, the third column address decode circuitry being positioned proximate at least one of a first and a second end of the second plurality of column select lines, wherein the second column address decode circuitry is adapted to select at least one column line from one of the subsets of the first plurality of column lines and the second plurality of column lines.

9. The semiconductor memory device of claim 8, further comprising a plurality of sense amplifiers coupled to a plurality of the first column lines and to a plurality of the second column lines.

10. The semiconductor memory device of claim 8, further comprising a plurality of sense amplifiers, each sense amplifier adapted to be coupled to a column line in the first sub-array and to a column line in the second sub-array.

11. The semiconductor device of claim 8, wherein the input/output lines are positioned substantially parallel to the plurality of first and second column lines.

12. A semiconductor memory device, comprising:
   first and second sub-arrays, each sub-array having a plurality of memory cells coupled to a plurality of row lines and a plurality of column lines in the sub-array;
   first and second row address decode circuitry coupled to the first and second sub-arrays, respectively, and adapted to select at least one row line in their respective sub-arrays;
   first column address decode circuitry coupled to a first plurality of column select lines, the first plurality of column select lines situated substantially parallel to the row lines in the first sub-array, the first column address decode circuitry positioned proximate at least one of a first and a second end of the first plurality of column select lines and adapted to select a subset of the plurality of column lines in the first sub-array;
   second column address decode circuitry coupled to a second plurality of column select lines, the second plurality of column select lines situated substantially parallel to the plurality of row lines in the second sub-array, the second column address decode circuitry positioned proximate at least one of a first and a second end of the second plurality of column select lines and adapted to select a subset of the plurality of column lines in the second sub-array;
   third column address decode circuitry coupled to a third plurality of column select lines and adapted to select at least one of the column lines from one of the subsets selected by one of the first and second column address decode circuitry; and
   a plurality of input/output lines situated substantially parallel to the plurality of column lines in the first and second sub-arrays and adapted to transmit data signals to and from at least one memory cell in one of the first and second sub-arrays.

13. The semiconductor memory device of claim 12, further comprising a plurality of sense amplifiers, each sense amplifier adapted to be coupled to a column line in the first sub-array and to a column line in the second sub-array.

14. The semiconductor memory device of claim 12, wherein the third column address decode circuitry is adapted to select at least one column line from only one of the first and second sub-arrays.

15. The semiconductor memory device of claim 14, further comprising a plurality of sense amplifiers, each sense amplifier adapted to be coupled to a column line in the first sub-array and to a column line in the second sub-array.

16. A semiconductor memory, comprising:
   first and second sub-arrays, each sub-array including a plurality of memory cells;
   first row address decode circuitry coupled to row lines in the first sub-array and adapted to select at least one row of memory cells in the first sub-array;
   second row address decode circuitry coupled to row lines in the second sub-arrays adapted to select a row of memory cells in the second sub-array;
   first column address decode circuitry coupled to first column select lines in the first sub-array and adapted to select a first subset of column lines in the first sub-array, the first column select lines arranged generally parallel to the row lines in the first sub-array, the first column address decode circuitry positioned proximate at least one of a first and a second end of the first column select lines;
   second column address decode circuitry coupled to second column select lines in the second sub-array and adapted to select a second subset of column lines in the second sub-array, the second column select lines arranged generally parallel to the row lines in the second sub-array, the second column address decode circuitry positioned proximate at least one of a first and a second end of the second column select lines;
   a plurality of sense amplifiers arranged between the first and second sub-arrays, each sense amplifier adapted to be coupled to a column line in the first sub-array and to a column line in the second sub-array;
   third column address decode circuitry adapted to couple at least one of the column lines from one of the first and second subsets of column lines to at least one of the sense amplifiers.

17. The semiconductor memory of claim 16, wherein the third column address decode circuitry is adjacent the sense amplifiers.

18. The semiconductor memory of claim 17, wherein the first and second column address decode circuitry is adjacent the first and second row address decode circuitry, respectively.

19. The semiconductor memory of claim 16, wherein the first and second column address decode circuitry is adjacent the first and second row address decode circuitry, respectively.

20. The semiconductor memory of claim 16, further comprising a plurality of input/output lines arranged generally parallel to the column lines in the first and second sub-arrays and adapted to transmit data to and from memory cells in the first and second sub-arrays.

21. The semiconductor memory of claim 20, wherein the third column address decode circuitry is adjacent the sense amplifiers.

22. The semiconductor memory of claim 21, wherein the first and second column address decode circuitry is adjacent the first and second row address decode circuitry, respectively.

23. The semiconductor memory of claim 20, wherein the first and second column address decode circuitry is adjacent the first and second row address decode circuitry, respectively.

* * * * *